(12) United States Patent
Hickman

(10) Patent No.: US 6,727,975 B1
(45) Date of Patent: Apr. 27, 2004

(54) DEVICE AND METHOD OF CORRECTING EXPOSURE DEFECTS IN PHOTOLITHOGRAPHY

(75) Inventor: Craig A. Hickman, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/332,856

(22) Filed: Jun. 14, 1999

(51) Int. Cl.[7] .................. G03B 27/68; G03B 27/54; G03B 27/72
(52) U.S. Cl. ............... 355/52; 355/67; 355/71
(58) Field of Search .................. 355/52, 67, 71, 355/53; 430/5, 322; 359/885, 889, 559, 560, 562, 564

(56) References Cited

U.S. PATENT DOCUMENTS

| | | | |
|---|---|---|---|
| 4,588,293 A | * 5/1986 | Axelrod | 356/239 |
| 5,142,132 A | 8/1992 | MacDonald et al. | 250/201.9 |
| 5,486,896 A | * 1/1996 | Hazama et al. | 355/71 |
| 5,521,033 A | * 5/1996 | Okamoto | 430/5 |
| 5,640,233 A | 6/1997 | McArthur et al. | 356/124 |
| 5,795,685 A | * 8/1998 | Liebmann et al. | 430/5 |
| 5,828,455 A | 10/1998 | Smith et al. | 356/354 |
| 5,838,433 A | * 11/1998 | Hagiwara | 356/237 |
| 6,115,108 A | * 9/2000 | Capodieci | 355/77 |
| 6,151,103 A | * 11/2000 | Shu et al. | 355/71 |
| 6,235,434 B1 | * 5/2001 | Sweeney et al. | 430/5 |
| 6,346,979 B1 | * 2/2002 | Ausschnitt et al. | 355/53 |

* cited by examiner

*Primary Examiner*—Rodney Fuller
(74) *Attorney, Agent, or Firm*—Knobbe, Martens, Olson & Bear LLP (57) ABSTRACT

A corrective filter for use in an optical system to correct a defect in a reticule and/or pellicle. The corrective filter may be positioned between a light source and the reticule, between the reticule and a wafer, or in combination with the reticule and/or pellicle. The invention provides a method of characterizing the optical properties of the corrective filter.

23 Claims, 5 Drawing Sheets

DEVICE AND METHOD OF CORRECTING EXPOSURE DEFECTS IN PHOTOLITHOGRAPHY

BACKGROUND OF THE INVENTION

1. Field of the Invention

The invention relates generally to the correction of exposure variations in an optical system. More particularly, this invention relates to correcting variations introduced by one or more components, such as a reticule or pellicle, into the exposure field of the optical system.

2. Description of the Related Art

Optical systems are widely used in the microelectronics industry to manufacture semiconductor wafers by a process known as photolithography. Typically, a photolithography system comprises a light source configured to project light rays to a condenser lens. The condenser lens collimates the light rays towards a pellicle placed before (or after) a reticule. Typically, the reticule is an optically clear quartz substrate having a chrome pattern used to project an image onto a portion of a photoresist-coated wafer. The pellicle is a very thin, transparent film which seals off the reticule surface from airborne particulates and other forms of contamination. A projection lens is placed after the reticule to receive and focus the light rays onto an exposure field on the wafer.

In designing such an optical system, any one of these components may be vulnerable to manufacturing imperfections which, even if minutely small, may cause intolerable or unacceptable defects in the photoresist layer of the wafer. For example, aberrations due to defects in one or more lenses may include distortion, curvature of field, spherical aberration, and astigmatism. Moreover, distortions may be due to defects in the reticule that may be caused during manufacturing. For example, reticule defects may arise from impurities in the chrome, lack of adhesion of the chrome to the reticule, variances in ion beam used to produce chrome etching, or other similar defects. Reticule defects may cause intolerable or unacceptable variations in critical dimensions (CD's) in the exposure field. ACD represents the width or space of critical elements in an integrated circuit (IC).

Several attempts were made in the industry to compensate for general defects in the optical system. For example, in U.S. Pat. No. 5,640,233 issued to McArthur et al., a two-plate corrector is disclosed in a stepper configuration so that an image from a reticule plane is projected to an ideal image at an object plane. Based on the premise that depth of field correction made at the reticule plane induces insignificant distortion, McArthur describes placement of the two-plate corrector at the reticule plane to correct depth of field distortions caused by the lens system. However, McArthur does not describe how to correct defects resulting from specific components, such as the reticule or pellicle.

To eliminate undesirable variances that result from defects in the reticule, some manufacturers simply replace the defective reticule with a new reticule. Other manufacturers resort to discarding wafers having intolerable CD's caused by the defective reticule. In either case, a significant increase in manufacturing cost due to reticule defects has become unavoidable.

Therefore, there is a need in the industry to compensate for individual component defects without having to replace the component or discard any defective wafers resulting therefrom. The solution of correcting such defects should be cost-effective and easy to implement.

SUMMARY OF THE INVENTION

To overcome the above-mentioned limitations, the invention provides a photolithography system having a light source configured to project light onto an object. The system comprises a reticule positioned to receive the projected light from the light source, wherein the reticule includes a defect. The system further comprises a filter positioned between the light source and the reticule. The filter has a corrective element that is geometrically related to the location of and configured to substantially correct the defect in the reticule. In another embodiment, the photolithography system comprises a reticule positioned at a reticule distance from the light source to receive light therefrom, wherein the reticule includes a defect. The system further comprises a filter positioned at a filter distance from the light source that is greater than the reticule distance. The filter is configured to receive light passing through the reticule. The filter has a corrective element that is geometrically related to the location of and configured to substantially correct the defect in the reticule.

In another embodiment, the invention provides a reticule configured for use in a photolithography system. The reticule comprises a first plate having a predetermined pattern which includes a defect for projection onto an exposure field. The reticule further comprises a second plate attached to the first plate. The second plate comprises a filter having a corrective element that is geometrically related to the location of and configured to substantially correct the defect in the first plate. The invention also provides a method of correcting a defect in the reticule of the photolithography system. The method comprises the step of obtaining at least one measurement of a feature in an exposed image. The method further comprises the step of analyzing the measurement in connection with an expected feature in the exposed image. The method further comprises the step of determining the optical characteristics of a filter based on the analyzing step, the filter being suitable for substantially correcting the defect in the reticule.

BRIEF DESCRIPTION OF THE DRAWINGS

The above and other aspects, features and advantages of the invention will be better understood by referring to the following detailed description, which should be read in conjunction with the accompanying drawings, in which.

DETAILED DESCRIPTION OF THE PREFERRED EMBODIMENT

The following description is not to be taken in a limiting sense, but is made merely for the purpose of describing the general principles of the invention. The scope of the invention should be determined with reference to the claims.

Figure 1:
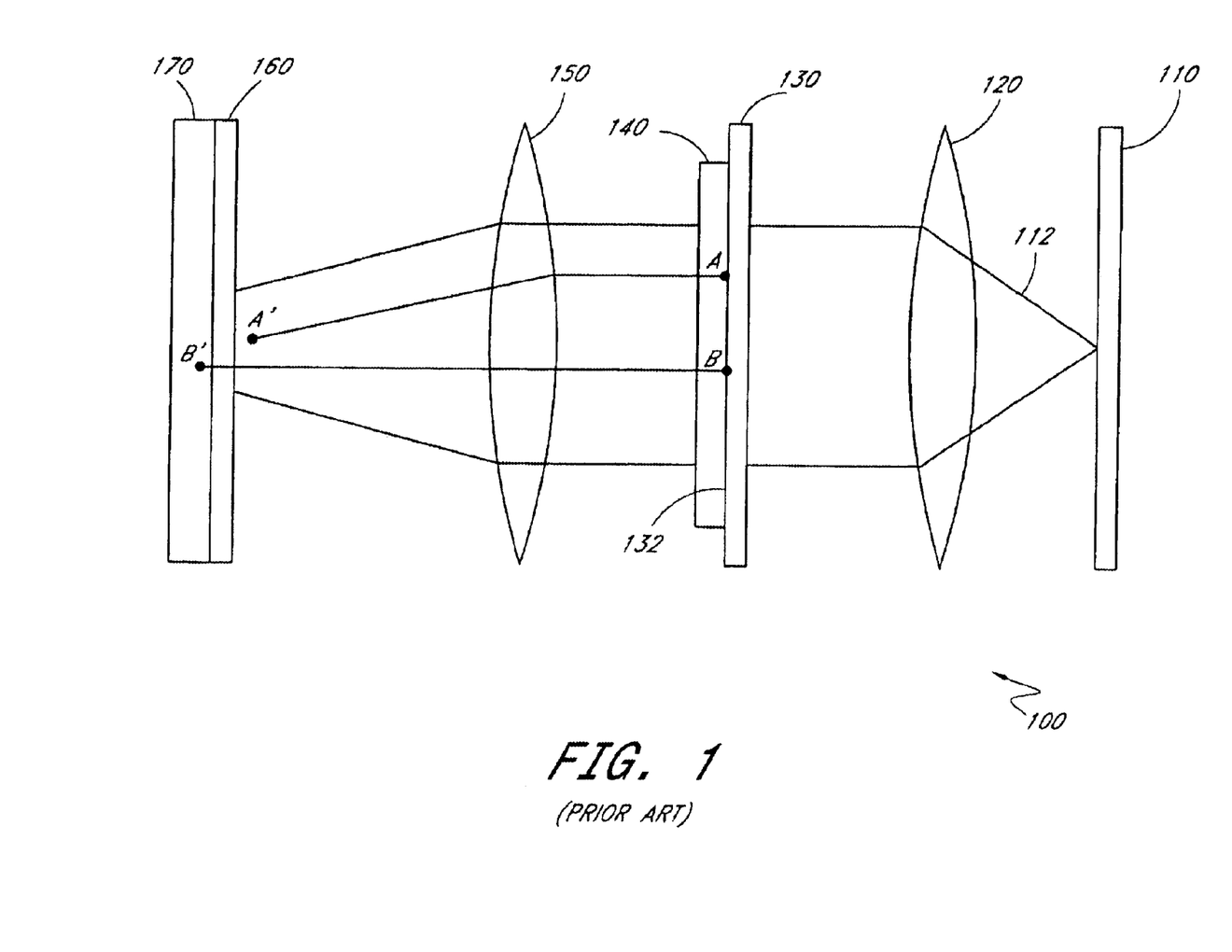
FIG. 1 is a schematic diagram showing a typical optical system having a defective reticule.

FIG. 1 is a schematic diagram showing typical physical components of an optical system having a defective reticule. A photolithography system 100 comprises a light source 110 configured to project light rays 112 to a condenser lens 120. The condenser lens 120 collimates the light rays towards a reticule 130 having a chrome pattern 132. As noted above, the reticule 130 may be an optically clear quartz substrate used to project an image onto a surface. The reticule 130 is often covered by a pellicle 140 to seal off the surface of the reticule 130 from airborne particulates and other forms of contamination. As further described below, contaminants may interfere with the optical characteristics of the reticule 130 and, hence, distort the projection of the pattern 132. The pellicle 140 is a very thin, transparent film which may not interfere with the optical characteristics of the reticule 130. The pellicle 140 may also reduce the frequency of cleaning and extend the life time of the reticule 130.

The pellicle 140 passes the light rays 112 to a lens system 150. Although only one lens is shown in FIG. 1, the lens system 150 may comprise one or more optical lenses. The lens system 150 focuses the light rays 112 onto an exposure field, such as a photoresist layer 160. The photoresist layer 160 typically comprises a light-sensitive, substantially uniform, and thin film spread on a wafer 170. A desired pattern may be formed by exposing the photoresist layer 160 to light that is masked with a predetermined pattern, e.g., the pattern 132 of the reticule 130.

As described above, when designing such an optical system, any one of these components may be subject to manufacturing imperfections. More particularly, pattern distortions may result from defects caused during manufacturing of the reticule 130 or pellicle 140. These defects may cause unacceptable variations in the pattern on the photoresist layer 160. For example, due to a defect in the reticule 130, a point A of the pattern 132 may be projected as A' at a location before its intended projected location on the photoresist layer 160. Similarly, a point B of the pattern 132 may be projected as B' at a location after its intended projected location on the photoresist layer 160. Accordingly, any point on the pattern 132 may deviate from its intended projected location due to a distortion in virtually any geometric direction of the three dimensional space. As noted above, any of these pattern distortions may vary the CD's in the wafer 170 to unacceptable levels, which include CD's that are bridged, relatively small, scummed, or other defects which are generally known for CD's in the art. Accordingly, it is desirable to correct these distortions without having to replace the reticule 130 and/or pellicle 140.

Figure 2:
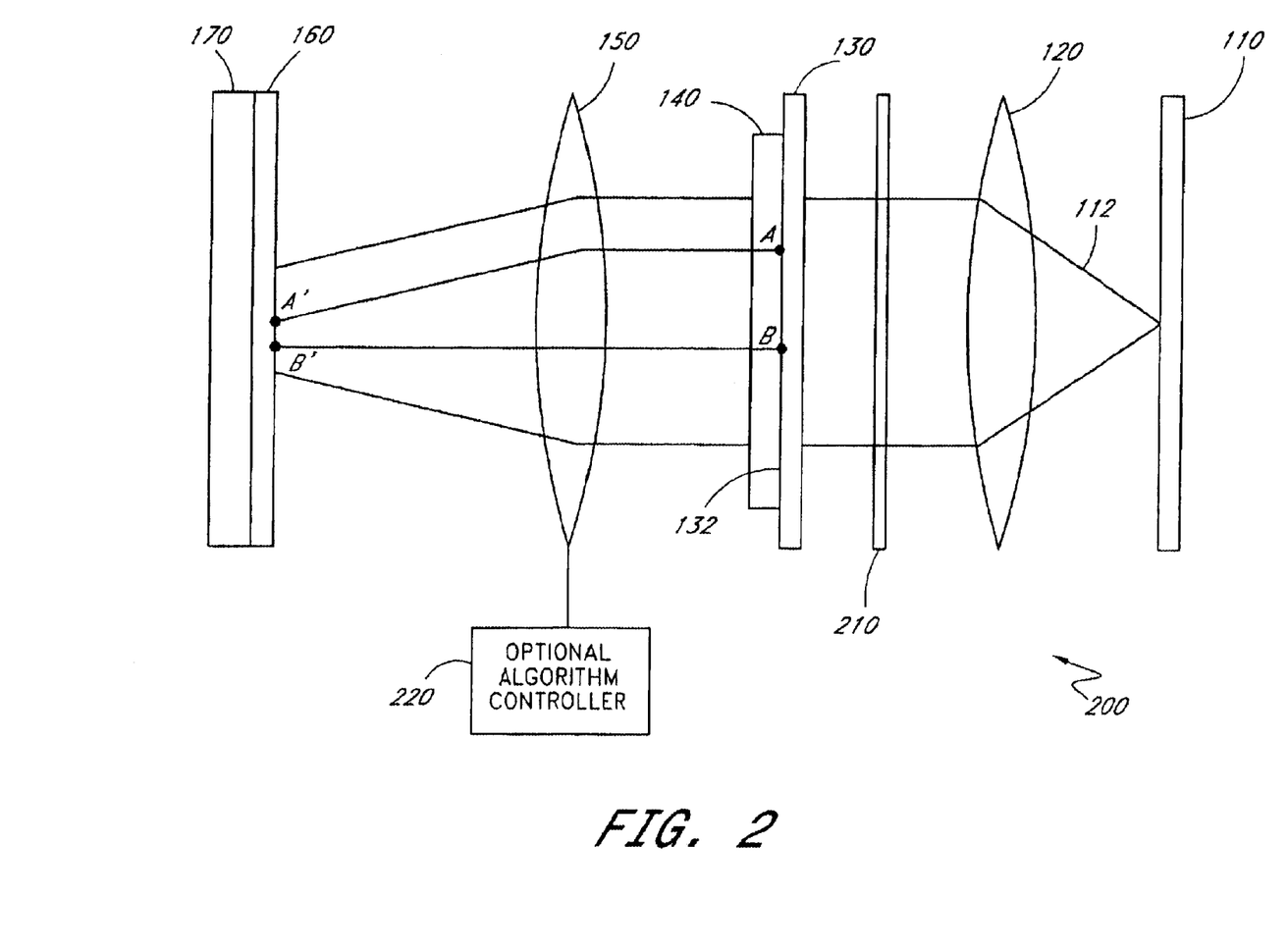
FIG. 2 is a schematic diagram of the optical system of FIG. 1 having the corrective filter in accordance with the invention.

FIG. 2 is a schematic diagram of the photolithography system 200 having a corrective filter 210 in accordance with the invention. In one embodiment, the corrective filter 210 may be placed at any position between the light source 110 and reticule 130, as shown in FIG. 2. In another embodiment, the corrective filter 210 may be placed between the reticule 130 and photoresist layer 160, i.e., after the reticule 130. It is desirable to place the corrective filter 210 at a location that does not interfere with heat dissipation characteristics of the lens system 150. In some applications, the lens system 150 may heat up due to energy emanating from the light rays. Typically, the rise in temperature of the lens system 150 affects its optical properties and, consequently, causes a distorted projection of light onto the photoresist layer 160. To compensate for such optical distortion, the lens system 150 is often controlled by an optical algorithm 220 which adjusts the optical properties of the lens system 150 as a function of temperature. Placing an object within a close proximity of the lens system 150 may interfere with its heat dissipation characteristics and cause the optical algorithm to erroneously compensate for heat variations. The distance between the lens system 150 and reticule 130 varies from one photolithography system to another and, generally, is about 3–4 inches. Thus, it is desirable to place the corrective filter 210 at a minimum distance of about 1 inch from the lens system 150. However, if the machinery or robotic equipment that places the corrective filter 210 is configurable to such distances, other distances may be acceptable so long as interference with heat dissipation characteristics of the lens system 150 is tolerable.

In another embodiment, the corrective filter 210 may be designed for placement in close proximity to, or manufactured in combination with, the reticule 130. For example, the pellicle 140 may be designed to have the corrective properties of the corrective filter 210 for attachment to the reticule 130. Alternatively, the corrective filter 210 may be designed separately from the pellicle 140 and attached to the reticule 130 to form a substantially coherent unit. In such an embodiment, the reticule 130 effectively comprises a first plate that contains the predetermined pattern and a second plate attached to the first plate. Thus, the second plate includes the corrective filter 210. As demonstrated by these examples, there may be several design variations and locations of the corrective filter 210 which will become apparent to one of ordinary skill in the art from this description.

With the corrective filter 210 positioned between the condenser lens 120 and reticule 130, the reticule 130 correctly projects the pattern 132 onto the photoresist layer 160. More particularly, the corrective filter 210 compensates for any variation in substantially all the points of the pattern 132. For example, the corrective filter 210 corrects the projection of the point A of the pattern 132 so that its projection A' is located at the intended position on the photoresist layer 160. Similarly, the point B of the pattern 132 is corrected so that its projection B' is located at the intended position on the photoresist layer 160. As illustrated by the projection of the two points A and B, the corrective filter 210 corrects substantially all forms of optical distortions including reticule and pellicle defects due to myopia, hyperopia, and astigmatism.

Figure 3:
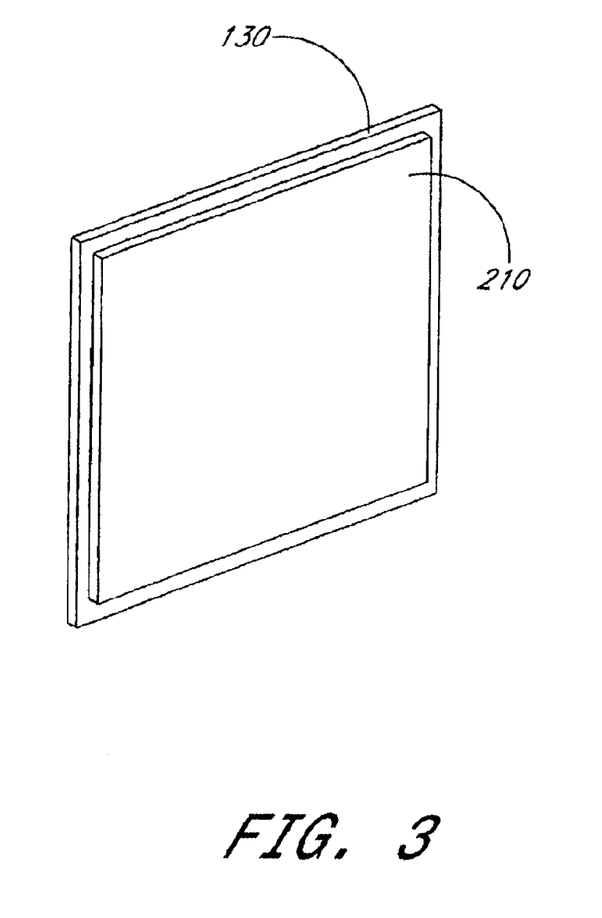
FIG. 3 is a perspective view of one embodiment of the corrective filter built in combination with a defective reticule.

FIG. 3 is a perspective view of one embodiment of the corrective filter 210 built in combination with a defective reticule 130. As noted above, the corrective filter 210 may be attached to the reticule 130 so as to substantially form a coherent unit. In one embodiment, the corrective filter 210 may be designed to take over the functions of the pellicle 140, thereby protecting the surface of the reticule 130 from airborne particulates and other forms of contamination. In another embodiment, the corrective filter 210 may, in addition to the pellicle 140, be attached to the reticule 130. Moreover, depending on the application, the corrective filter 210 may be attached anterior or posterior to the reticule 130.

Although a rectangular shape is shown for the corrective filter 210 in FIG. 3, it will be understood that the geometric shape of the corrective filter 210 may be customized to fit virtually any desired dimensions and shapes suitable for the photolithography system 200. For example, the corrective filter 210 may have a shape that is a square, oval, elliptical, polygonal, trapezoidal, and other similar geometric shapes. The corrective filter 210 may comprise any material commonly used to manufacture optical filters in the art, such as fused silica or calcium fluoride. Given the optical characteristics of the corrective filter 210, one of several techniques may be employed to manufacture the corrective filter 210. These techniques include diamond milling, ion-milling, and mechanical polishing.

Figure 4:
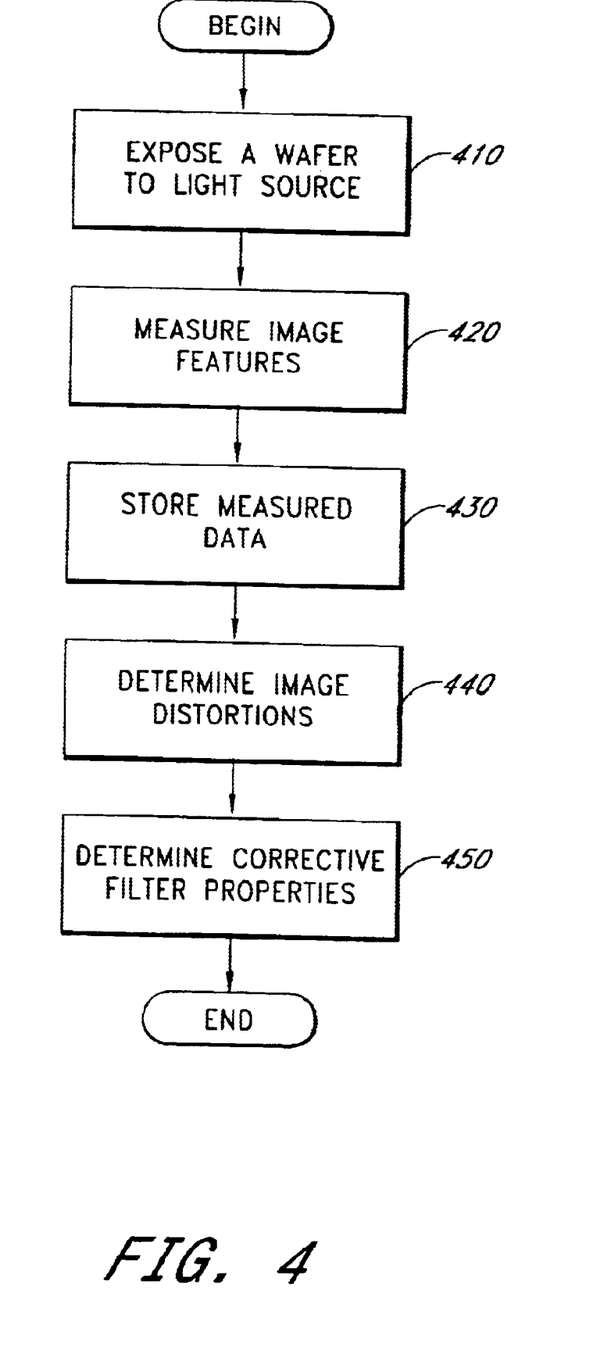
FIG. 4 is a flowchart describing the steps of determining the characteristics of the corrective filter of FIG. 2.

FIG. 4 is a flowchart describing the steps of determining the optical properties of the corrective filter of FIG. 2. To determine the optical properties of the corrective filter 210, the following method may be followed. At block 410, the wafer 170 is exposed to the light source, as illustrated in FIG. 1. Generally, it is desirable to include a lens system to compensate for the reticule's magnification (or reduction) effect on the exposed image. In some cases, e.g., if the reticule has no significant distortion on the dimension of the image, it may be unnecessary to include a lens system when exposing the wafer to the light source. A measuring instrument, such as a scanning electron microscope model number 7830SI manufactured by KLA or 8100XP manufactured by OPAL, measures one or more image features in the projected pattern on the photoresist layer 160 (block 420). Some of the measured features may include positional offsets, distances between lines and spaces, line CD's, and contact related features. The lines may be produced by the pattern 132 in an isolated (e.g., a single line) or dense (e.g., a group of multiple lines) form in the exposure field. The measurements may be taken in the horizontal, vertical, sagittal, and/or tangential geometric planes. Depending on the microscope, the measurements may be taken with varying degrees of resolution, which is often expressed in picture element (pixel) per unit area (e.g., inch) or pixel density. As is well known in the art, as the resolution increases, the finer and more detailed are the measurements. Hence, if desired, the resolution may be selectively increased to improve the accuracy of correction. More particularly, for fine (e.g., smaller CDs) reticule regions the resolution of measurement may be selectively increased. Similarly, for coarse (e.g., larger CDs) reticule regions the resolution of measurement may be selectively decreased. Hence, the type of measurements may vary to accommodate various regions of the same reticule 130.

The measurements may be stored in a computer memory, such as a hard disk, for further processing (block 430). Programmed with proper instructions, the computer analyzes the measurements to determine the distortions or errors across the exposure field (block 440). For example, based on the geometric difference between measured and expected projected point features, such as point size and positional offset, the computer determines the optical deviation (i.e., offset) of the projected image from that expected by a defect-free reticule. The instructions may be programmed using any computer language used in the art, such as C, Fortran, or other similar languages. Alternatively, a dedicated processor having instructions in the form of firmware may be used to implement this method. In either case, based on the calculated offsets for all measured pixels, the computer determines the optical correction characteristics of the corrective filter 210 (block 450).

Figure 5A:
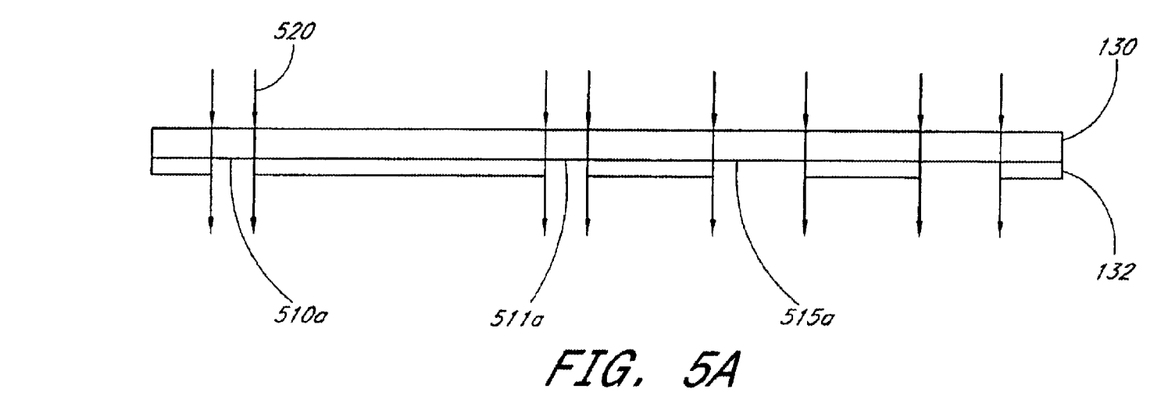
FIG. 5A is a ray diagram of a reticule having one or more defects.

FIG. 5A is a ray diagram of light rays passing through the reticule 130 having one or more defects. As shown in FIG. 5A, the reticule 130 typically includes a pattern 132 that causes a desired pattern to be projected in the exposure field on the wafer 170 (not shown in this figure). As noted above, as light rays 520 pass through the reticule 130, a defect in the reticule 130 causes a defect in the pattern of the exposed image. For example, the defect may comprise regions 510a and 511a that are unacceptably narrow or small. The defective regions 510a and 511a may be caused by an excess overflow of the layer of the pattern 132. If left uncorrected, the regions 510a and 511a cause unacceptable defects (e.g., CD variations) in the exposure field of the wafer 170.

Figure 5B:
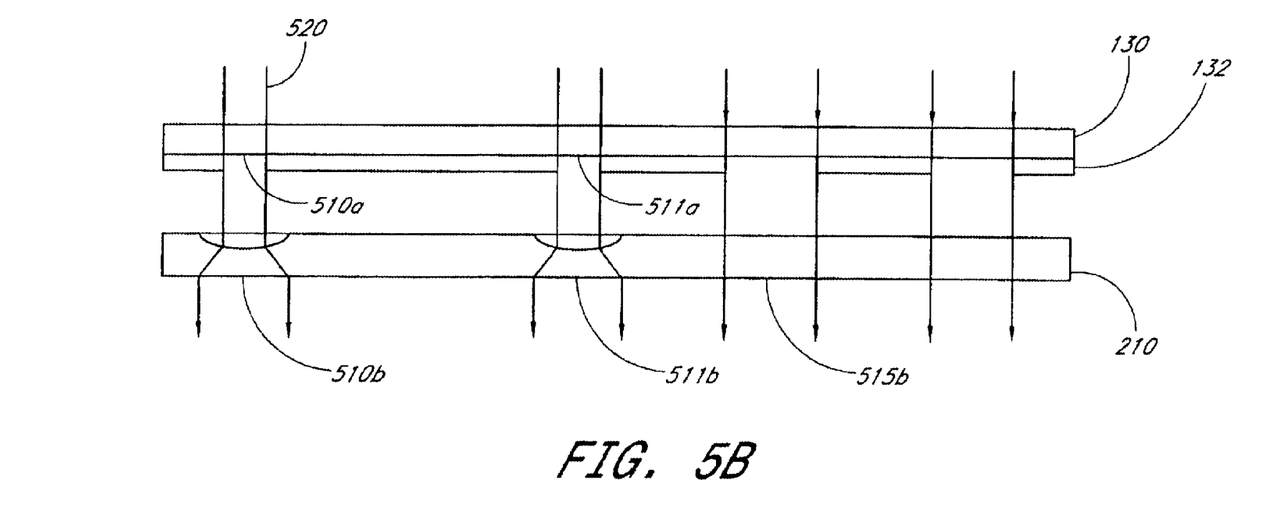
FIG. 5B is a ray diagram of the reticule of FIG. 5A after correction by the corrective filter in accordance with the invention.

Accordingly, FIG. 5B shows a ray diagram of light rays passing through the reticule 130 after correction by the corrective filter 210 in accordance with the invention. In this embodiment, the corrective filter 210 is placed after the reticule 130, i.e., at a distance from the light source 110 (not shown in this figure) that is greater than the distance between the reticule 130 and the light source 110. It is desirable to position and, more particularly, align the corrective filter 210 so as to cause light rays received from the defective regions 510a and 511a to diverge, thereby widening the defective regions 510a and 511a to regions 510b and 511b, respectively. Thus, the corrective filter 210 includes corrective elements having optically divergent properties, such as one or more divergent lens-like regions 510b and 511b that are optically aligned to respectively correct the defective regions 510a and 511a to the same or various degree of divergence. In other embodiments, the corrective filter 210 may include one or more convergent lens-like regions (not shown in this figure) that are optically aligned with defective reticule regions requiring same or various degrees of convergence. Additionally, the corrective filter 210 may include one or more regions 515b having a substantially small or no optical effect on light rays received from reticule regions that are not defective, or having only minor defects, e.g., the region 515a.

Therefore, with its convergent and divergent optical properties, the corrective filter 210 may correct virtually all forms of reticule defects, including deviations in the pattern 132 due to an absence of or excess in pattern material (e.g., chrome). Moreover, the corrective filter 210 may correct defects arising from the lens system 150, or from any other source in the photolithography system 100. Accordingly, in some applications, the corrective filter 210 may compensate for defects without having to determine the exact source of the defect.

In view of the foregoing, it will be appreciated that the invention overcomes the long-standing need for a correction filter and method of correcting defects in individual components of an optical system, such as the reticule. The invention may be embodied in other specific forms without departing from its spirit or essential characteristics. The described embodiment is to be considered in all respects only illustrative and not restrictive. The scope of the invention is, therefore, indicated by the appended claims rather by the foregoing description. All changes which fall within the meaning and range of equivalency of the claims are to be embraced within their scope.

What is claimed is:

1. A photolithography system having a light source configured to project light onto an object, the system comprising:

a reticule positioned to receive the projected light from the light source, wherein the reticule includes a defect; and a filter positioned between the light source and the reticule, the filter having a corrective element that is geometrically related to the location of and configured to compensate for the defect in the reticule.

2. The system as defined in claim 1, further comprising a wafer coated with a photo-resist layer and positioned to receive the projected light passing through the reticule.

3. The system as defined in claim 2, further comprising at least one lens positioned between the reticule and the wafer.

4. The system as defined in claim 1, further comprising a lens positioned between the light source and the reticule.

5. The system as defined in claim 1, wherein the filter is attached to the reticule.

6. The system as defined in claim 1, wherein the filter comprises a pellicle that is attached to the reticule.

7. The system as defined in claim 1, wherein the corrective element configured to compensate for the defect in the reticule accomplishes correction of the defect.

8. A photolithography system having a light source configured to project light onto an object, the system comprising:
   a reticule positioned at a reticule distance from the light source to receive light therefrom, wherein the reticule includes a defect;
   a filter positioned at a filter distance from the light source that is greater than the reticule distance and that allows the filter to receive light passing through the reticule, and the filter having a corrective element that is geometrically related to the location of and configured to compensate for the defect in the reticule; and
   a controller configured to compensate for an optical distortion due to a variation in temperature in the photolithography system.

9. The system as defined in claim 8, further comprising a wafer coated with a photo-resist layer and positioned to receive the projected light passing through the reticule.

10. The system as defined in claim 9, further comprising at least one lens positioned between the reticule and the wafer.

11. The system as defined in claim 8, wherein the filter is attached to the reticule.

12. The system as defined in claim 8, wherein the filter comprises a pellicle that is attached to the reticule.

13. The system as defined in claim 8, wherein the corrective element configured to compensate for the defect in the reticule accomplishes correction of the defect.

14. A method of correcting a defect in a reticule of a photolithography system, the method comprising:
   obtaining at least one measurement of a feature in an exposed image;
   analyzing the measurement in connection with an expected feature in the exposed image;
   determining the optical characteristics of a filter based on the analyzing step, the filter being suitable for compensating for the defect in the reticule; and
   positioning the filter between a light source and the reticule to compensate for the defect in the reticule.

15. The method as defined in claim 14, further comprising the step of projecting light onto a wafer coated with a photoresist layer to form the exposed image.

16. The method as defined in claim 15, further comprising the step of positioning the filter between reticule and the wafer.

17. The method as defined in claim 14, wherein the step of obtaining at least one measurement include the step of recording a pixel's offset distance from an expected location.

18. The method as defined in claim 14, wherein the step of obtaining at least one measurement include the step of recording a pixel's offset dimension from an expected size.

19. The method as defined in claim 14, wherein compensating for the defect in the reticule accomplishes correction of the defect.

20. A photolithography system having a light source configured to project light onto an object, the system comprising:
   means for patterning the light positioned to receive the projected light from the light source, wherein the patterning means includes a defect; and
   means for compensating for the defect positioned between the light source and the patterning means, the compensating means having a corrective element that is geometrically related to the location of and configured to compensate for the defect in the patterning means.

21. The system as defined in claim 20, wherein the means for compensating for the defect accomplishes correcting the defect.

22. A photolithography system having a light source configured to project light onto an object, the system comprising:
   means for patterning the light positioned at a first distance from the light source to receive light therefrom, wherein the patterning means includes a defect;
   means for compensating for the defect positioned at a second distance from the light source that is greater than the first distance and that allows the compensating means to receive light passing through the patterning means, and the compensating means having a corrective element that is geometrically related to the location of and configured to compensate for the defect in the patterning means; and
   means for compensating for an optical distortion due to a variation in temperature in the photolithography system.

23. The system as defined in claim 22, wherein the means for compensating for the defect accomplishes correcting the defect.

* * * * *

UNITED STATES PATENT AND TRADEMARK OFFICE
CERTIFICATE OF CORRECTION

PATENT NO. : 6,727,975 B1
DATED : April 27, 2004
INVENTOR(S) : Craig A. Hickman

It is certified that error appears in the above-identified patent and that said Letters Patent is hereby corrected as shown below:

Title page,
Item [57], ABSTRACT,
Lines 2, 3, 4 and 5, please replace "reticule" with -- reticle --.

Column 1,
Lines 11, 24, 26, 37, 39, 48, 52, 57, 58, 60 and 61, please replace "reticule" with -- reticle --.
Line 21, please replace "reticule" appearing twice with -- reticle --.

Column 2,
Lines 6, 7, 9, 11, 14, 17, 18, 21, 22, 23-24, 26, 31, 39, 48, 53-54, 57 and 59, please replace "reticule" with -- reticle --.
Line 13, please replace "reticule" appearing twice with -- reticle --.

Column 3,
Lines 4, 8, 9, 10, 12, 14, 17, 19, 29, 34, 36, 50, 55, 57 and 58, please replace "reticule" with -- reticle --.

Column 4,
Lines 6, 17, 20, 22, 23, 43, 47, 48, 51, 54 and 56, please replace "reticule" with -- reticle --.
Line 31, please replace "reticule" appearing twice with -- reticle --.

Column 5,
Line 10, please replace "reticule's" with -- reticle's --.
Lines 12, 32, 34, 37, 47, 56, 57, 60 and 61, please replace "reticule" with -- reticle --.

Column 6,
Lines 2, 5, 7, 20, 23, 28, 39, 52, 56, 58, 61, 63, 65 and 67, please replace "reticule" with -- reticle --.

Column 7,
Lines 2, 5, 10, 13, 14, 17, 23, 25, 28, 30, 33, 34, 43 and 44, please replace "reticule" with -- reticle --.
Lines 9 and 45, please replace "reticule" appearing twice with -- reticle --.

UNITED STATES PATENT AND TRADEMARK OFFICE
CERTIFICATE OF CORRECTION

PATENT NO.     : 6,727,975 B1
DATED          : April 27, 2004
INVENTOR(S)    : Craig A. Hickman It is certified that error appears in the above-identified patent and that said Letters Patent is hereby corrected as shown below:

Column 8,
Lines 2 and 11, please replace "reticule" with -- reticle --.

Signed and Sealed this

Eleventh Day of January, 2005

JON W. DUDAS
*Director of the United States Patent and Trademark Office*